(12) United States Patent
Eppich

(10) Patent No.: US 7,042,047 B2
(45) Date of Patent: May 9, 2006

(54) MEMORY CELL, ARRAY, DEVICE AND SYSTEM WITH OVERLAPPING BURIED DIGIT LINE AND ACTIVE AREA AND METHOD FOR FORMING SAME

(75) Inventor: Anton P. Eppich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 10/933,040

(22) Filed: Sep. 1, 2004

(65) Prior Publication Data

US 2006/0043473 A1     Mar. 2, 2006

(51) Int. Cl.
*H01L 21/8222* (2006.01)
(52) U.S. Cl. .................. 257/330; 257/300; 257/301; 257/302; 257/303; 257/304; 257/305; 257/306; 257/296; 257/311
(58) Field of Classification Search ............... 257/300, 257/301, 302, 303, 304, 305, 306, 311, 330, 257/296
See application file for complete search history.

(56) References Cited

U.S. PATENT DOCUMENTS

| | | | |
|---|---|---|---|
| 5,057,888 A * | 10/1991 | Fazan et al. | 257/303 |
| 5,469,208 A | 11/1995 | Dea | |
| 5,497,017 A | 3/1996 | Gonzales | |
| 5,907,170 A | 5/1999 | Forbes et al. | |
| 6,096,596 A | 8/2000 | Gonzalez | |
| 6,177,699 B1 | 1/2001 | Perug et al. | |
| 6,246,719 B1 | 6/2001 | Agarwal | |
| 6,417,040 B1 * | 7/2002 | Noble | 438/238 |
| 6,566,193 B1 | 5/2003 | Hofmann | |
| 6,610,566 B1 | 8/2003 | Forbes et al. | |
| 6,624,033 B1 | 9/2003 | Noble | |
| 6,689,660 B1 | 2/2004 | Noble et al. | |
| 6,812,512 B1 * | 11/2004 | Prall et al. | 257/296 |
| 2002/0030222 A1 * | 3/2002 | Agarwal | 257/310 |
| 2002/0179956 A1 * | 12/2002 | McTeer et al. | 257/308 |
| 2003/0209748 A1 * | 11/2003 | Basceri et al. | 257/296 |
| 2005/0104107 A1 * | 5/2005 | Fazan et al. | 257/296 |

* cited by examiner

Primary Examiner—B. William Baumeister
Assistant Examiner—Victor V. Yevsikov
(74) Attorney, Agent, or Firm—TraskBritt

(57) ABSTRACT

A memory cell, array and device include an active area formed in the substrate with a vertical transistor including a first end disposed over a first portion of the active area. The vertical transistor is formed as an epitaxial post on the substrate surface, extends from the surface of the substrate, and includes a gate formed around a perimeter of the epitaxial post. A capacitor is formed on the vertical transistor and a buried digit line vertically couples to a second portion of the active area. An electronic system and method for forming a memory cell are also disclosed.

42 Claims, 16 Drawing Sheets

MEMORY CELL, ARRAY, DEVICE AND SYSTEM WITH OVERLAPPING BURIED DIGIT LINE AND ACTIVE AREA AND METHOD FOR FORMING SAME

BACKGROUND OF THE INVENTION

1. Field of the Invention

The present invention relates in general to memory circuits and, more particularly, to dynamic random access memory cells and a method for forming the same.

2. State of the Art

Random access memory ("RAM") cell densities have increased dramatically with each generation of new designs and have served as one of the principal technology drivers for ultra large scale integration ("ULSI") in integrated circuit ("IC") manufacturing. However, in order to accommodate continuing consumer demand for integrated circuits that perform the same or additional functions and yet have a reduced size as compared with available circuits, circuit designers continually search for ways to reduce the physical size of the memory arrays within these circuits without sacrificing array performance.

With respect to memory ICs, the area required for each memory cell in a memory array partially determines the capacity of a memory IC. This area is a function of the number of elements in each memory cell and the size of each of the elements. For example, FIG. 1 illustrates an array 100 of memory cells 110 for a conventional dynamic random access memory (DRAM) device. Memory cells 110 are typically formed in adjacent pairs, where each pair is formed in a common active area 120 and share a common source/drain region that is connected to a respective digit line via a digit line contact 124. The area of the memory cells 110 is said to be $8F^2$, where F represents a minimum feature size for photolithographically-defined features. For conventional $8F^2$ memory cells, the dimension of the cell area is 2F×4F. The dimensions of a conventional $8F^2$ memory cell are measured along a first axis from the center of a shared digit line contact 124 (½F), across a word line 128 that represents an access transistor (1F), a storage capacitor 132 (1F), an adjacent word line 136 (1F), and half of an isolation region 140 (½F) separating the active area 120 of an adjacent pair of memory cells (i.e., resulting in a total of 4F). The dimensions along a second perpendicular axis are half of an isolation region 150 on one side of the active area 120 (½F), the digit line contact 124 (1F), and half of another isolation region 154 on the other side of the active area 120 (½F) (i.e., resulting in a total of 2F).

In some state-of-the-art memory devices, the memory cells for megabit DRAM have cell areas approaching 6F2. Although this is approximately a 25% improvement in memory cell area relative to conventional $8F^2$ memory cells, as previously described, a further reduction in memory cell size is still desirable. Therefore, there is a need for a still more compact memory cell structure and method for forming the same.

BRIEF SUMMARY OF THE INVENTION

The present invention is directed to a memory cell, array, device and system with an overlapping buried digit line and active area and method for forming the same. In one embodiment of the present invention, a DRAM cell is formed on a surface of a semiconductor substrate. The DRAM cell includes an active area formed in the substrate with a vertically oriented access transistor which includes a first end disposed over a first portion of the active area. The DRAM cell further includes a capacitor formed and electrically coupled to a second end of the access transistor. A buried digit line electrically couples using a vertically oriented contact to a second portion of the active area.

In another embodiment of the present invention, a memory cell formed on a substrate is provided. The memory cell includes an active area formed in the substrate with a vertical transistor including a first end disposed over a first portion of the active area. The vertical transistor is formed as an epitaxial post on the substrate surface and extends from the surface of the substrate. The vertical transistor includes a gate formed around a perimeter of the epitaxial post. A capacitor is formed on the vertical transistor and a buried digit line vertically couples to a second portion of the active area.

In yet another embodiment of the present invention, a memory array formed on a substrate is provided. The memory array includes at least one active area formed in the substrate and a plurality of memory cells formed in the at least one active area. Each of the plurality of memory cells includes a vertically oriented access transistor including a first end disposed over a first portion of the active area, a capacitor formed on and electrically coupled to a second end of the vertically oriented access transistor and a buried digit line electrically coupled in a vertically oriented contact to a second portion of the active area.

In a further embodiment of the present invention, a memory device is provided having an array of memory cells with row and column address circuitry coupled thereto with each of the memory cells of the device including an active area formed in the substrate with a vertically oriented access transistor disposed over a first portion of the active area. Each memory cell further includes a capacitor formed on and electrically coupled to a second end of the vertically oriented access transistor with a buried digit line electrically coupled in a vertically oriented contact to a second portion of the active area.

In yet a further embodiment of the present invention, an electronic system including a processor, an input device, an output device and a memory device coupled to the processor is provided. The memory device includes a memory array formed on a substrate including at least one active area having a plurality of memory cells formed in the at least one active area. At least one of the memory cells includes a vertically oriented access transistor including a first end disposed over a first portion of the active area with a capacitor formed on and electrically coupled to a second end of the vertically oriented access transistor. The memory cell further includes a buried digit line electrically coupled with a vertically oriented contact to a second portion of the active area.

In an additional embodiment of the present invention, a method is provided for forming a memory cell on a surface of a substrate. At least one active area is formed in the substrate and a vertically oriented access transistor is formed with a first end disposed over a first portion of the active area. A buried digit line is formed to electrically couple in a vertically oriented arrangement with a second portion of the active area. A capacitor is formed on a second end of the vertically oriented access transistor.

BRIEF DESCRIPTION OF THE SEVERAL VIEWS OF THE DRAWINGS

In the drawings, which illustrate what is currently considered to be the best mode for carrying out the invention.

As is conventional in the field of integrated circuit representation, the lateral sizes and thicknesses of the various layers are not drawn to scale, and portions of the various layers may have been arbitrarily enlarged or reduced to improve drawing legibility.

DETAILED DESCRIPTION OF THE INVENTION

Figure 1:
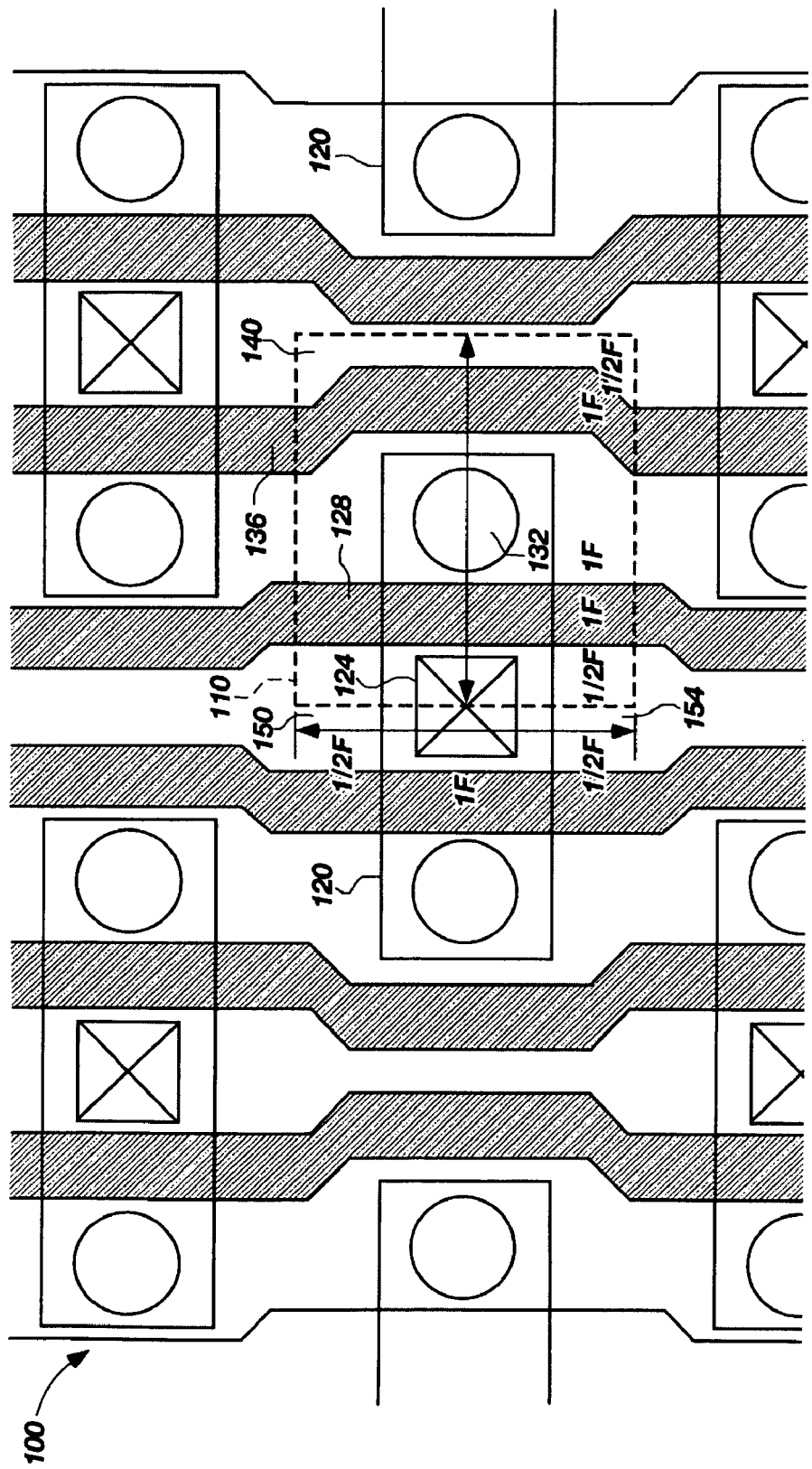
FIG. 1 is a simplified top plan view of conventional memory cells.
Figure 2A:
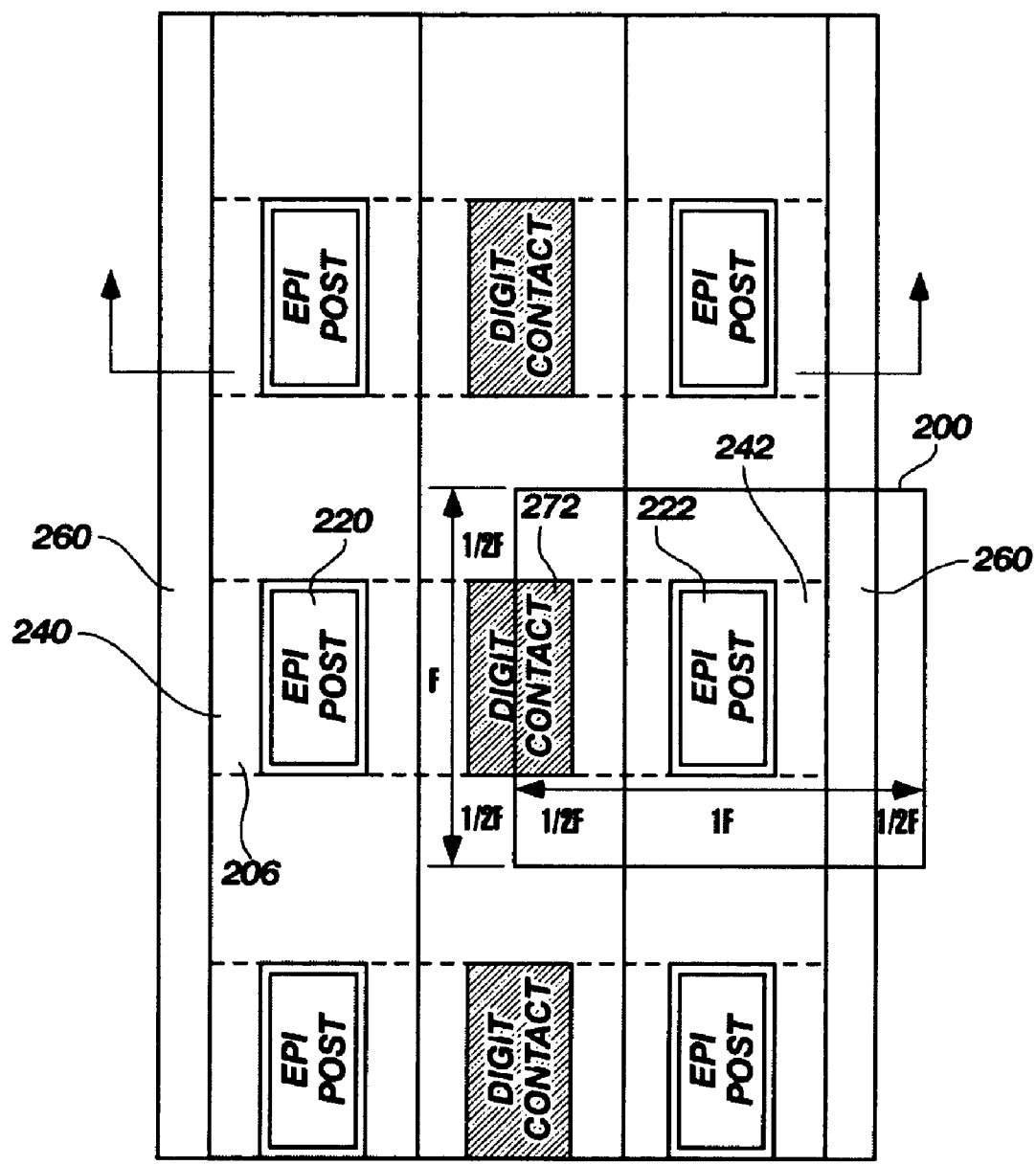
FIG. 2A is a simplified top plan view of memory cells according to an embodiment of the present invention.
Figure 2B:
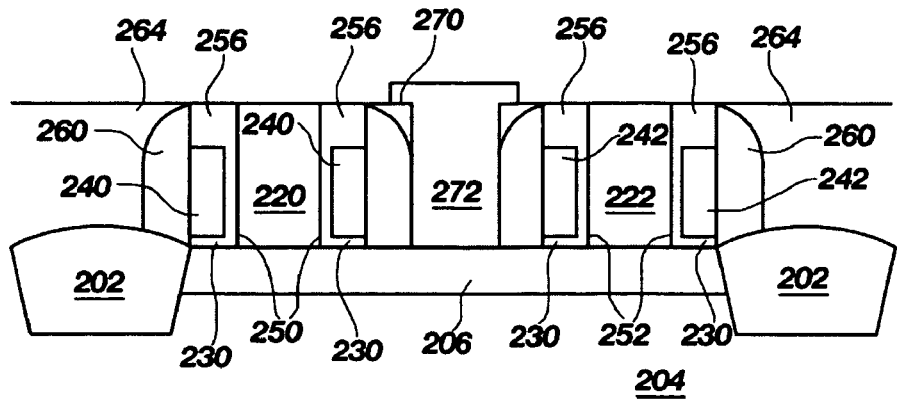
FIG. 2B is a simplified cross-sectional view of a pair of memory cells according to the embodiment shown in FIG. 2A.

FIG. 2A is a top plan view of an array of memory cells 200 according to an embodiment of the present invention. As shown in FIG. 2A, capacitors have not been illustrated in order to avoid unnecessarily obscuring the other structures of the memory cell 200. The dimensions of the cell 200 are $4F^2$. That is, the cell 200 measures 2F along a first axis, starting with half of a digit line contact (½F), and extending over an epitaxial post on which a capacitor is formed (1F) and half of an isolation region (½F). Along a second perpendicular axis, the cell 200 measures 2F, starting with half of an isolation region (½F), and extending over the digit line contact (1F), and half of another isolation region (½F). FIG. 2B is a simplified cross-sectional view of the memory cell 200 (FIG. 2A) along A—A at a stage of processing. A more detailed description of the memory cell 200 will be provided with respect to FIGS. 3 through 9, which illustrate the memory cell 200 at various stages of processing.

Figure 3:
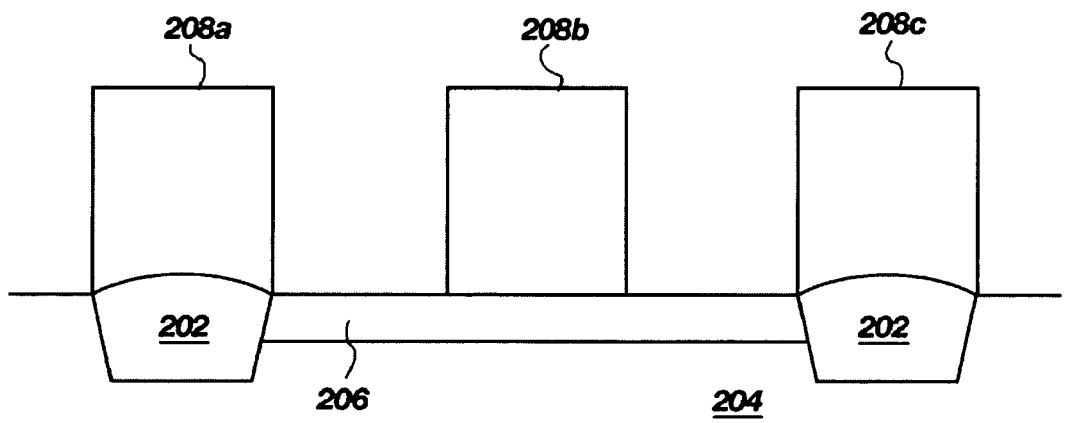
FIG. 3 is a simplified cross-sectional view of a semiconductor substrate that can be processed to form the memory cell of FIG. 2, in accordance with an embodiment of the present invention.

FIG. 3 is a simplified cross-sectional view of the memory cell 200 (FIG. 2A) at a stage of processing. Formed, for example, in a p-type substrate 204 is an n-type active area 206 in which a pair of memory cells 200 is formed. The active area 206 is isolated from adjacent active areas by isolation regions 202. The active area 206 and the isolation regions 202 may be formed using conventional methods, for example, conventional masking, deposition, implant and drive-in processes. Following the formation of the isolation regions 202 and the active area 206, a layer of insulating material is deposited onto the substrate 204, masked and etched to form sacrificial structures 208a–c on the substrate 204. The insulating material from which the sacrificial structures 208a–c are formed may be silicon nitride, or alternatively, as will be explained in more detail below, other insulating material to which subsequent etch processes are selective.

Figure 4:
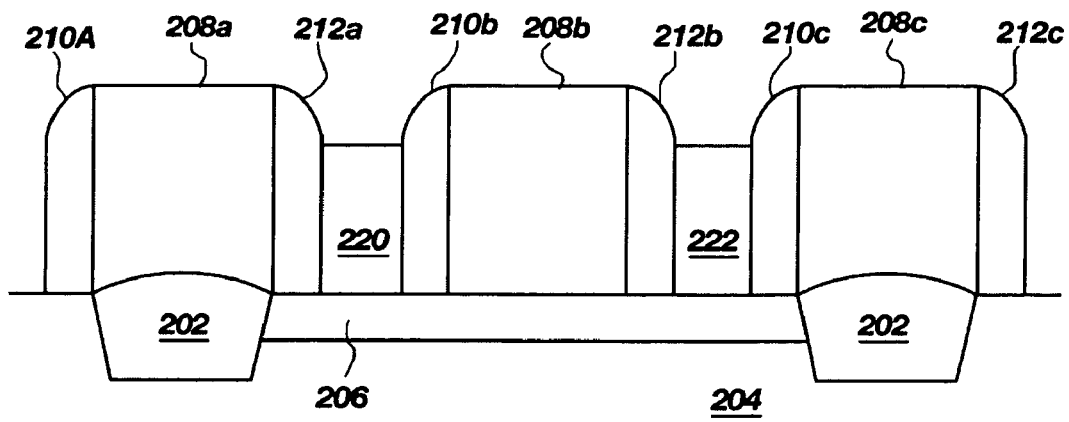
FIG. 4 is a simplified cross-sectional view of the substrate of FIG. 3 at a later point in processing, in accordance with an embodiment of the present invention.

FIG. 4 is a simplified cross-sectional view of the structure shown in FIG. 3 at a later point in processing, in accordance with an embodiment of the present invention. An insulating material is deposited over the substrate 204 and the sacrificial structures 208a–c and subsequently etched back using an anisotropic etch process. Suitable etch processes are known in the art. Sidewalls 210a–c, 212a–c are formed as a result of the deposition and etch back processes. The insulating layer can be formed from a silicon-oxide material, and the etch back process should be selective to the silicon nitride of the sacrificial structures 208a–c. A p-type epitaxial layer is formed on the exposed regions of the substrate 204, and etched to selectively form epitaxial "posts" 220, 222 within the trench region between the sacrificial structures 208a, 208b, and 208b, 208c, respectively. As will be described in more detail below, the epitaxial posts 220, 222 represent the material in which vertical access transistors (i.e., word lines) will be formed and to which memory cell capacitors are electrically coupled.

Figure 5:
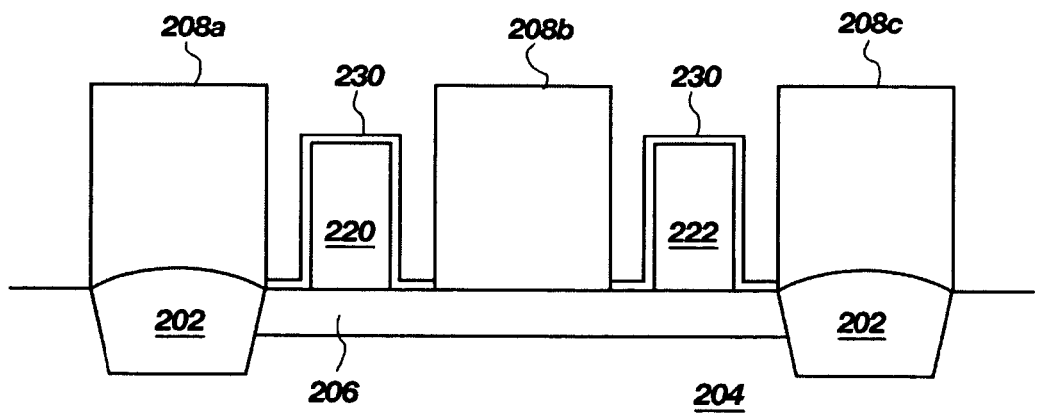
FIG. 5 is a simplified cross-sectional view of the substrate of FIG. 4 at a later point in processing, in accordance with an embodiment of the present invention.

FIG. 5 is a simplified cross-sectional view of the structure shown in FIG. 4 at a later point in processing, in accordance with an embodiment of the present invention. An etch process selective to the nitride sacrificial structures 208a–c and the epitaxial posts 220, 222 is performed to remove the oxide sidewalls 210a–c, 212a–c. Gate oxide 230 is then formed over the epitaxial posts 220, 222 and the exposed regions of the substrate 204. The material of the sacrificial structures 208a–c is such that oxide does not form thereon during the formation of the gate oxide 230.

Figure 6:
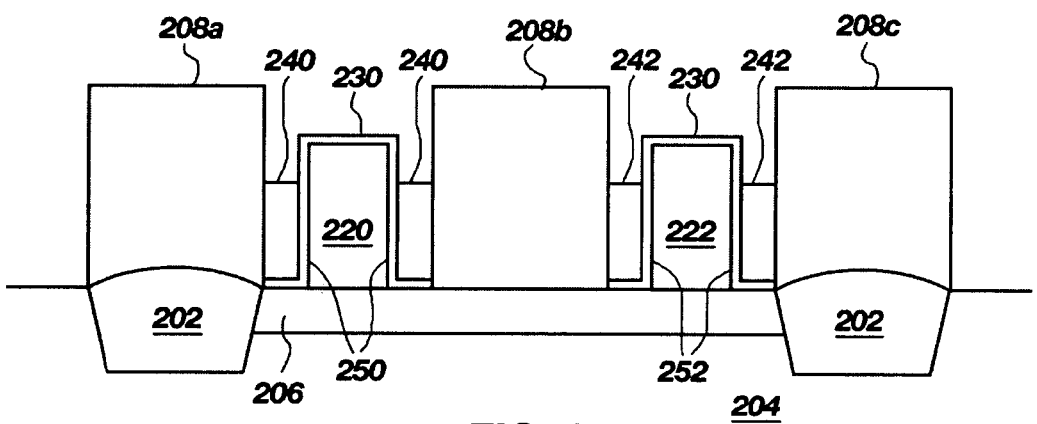
FIG. 6 is a simplified cross-sectional view of the substrate of FIG. 5 at a later point in processing, in accordance with an embodiment of the present invention.

FIG. 6 is a simplified cross-sectional view of the structure shown in FIG. 5 at a later point in processing, in accordance with an embodiment of the present invention. A polysilicon layer is formed over the structure of FIG. 5 followed by a masking and etch process to selectively remove portions of the polysilicon layer. An anisotropic etch back process is then performed to remove additional portions of polysilicon layer in order to form gates 240, 242 of access or vertical transistors 250, 252, respectively. The etch back process recesses the gates 240, 242 to below the height of the epitaxial posts 220, 222, respectively. Although shown in cross section in FIG. 6, the gates 240, 242 surround the respective posts 220, 222. This is apparent from FIG. 2A, which illustrates that the gate 242 is part of a continuous polysilicon word line that is formed around each of the epitaxial posts associated with the memory cells of that row. When activated by the respective word lines, the epitaxial posts as surrounded by the respective gates form a depletion region.

Figure 7:
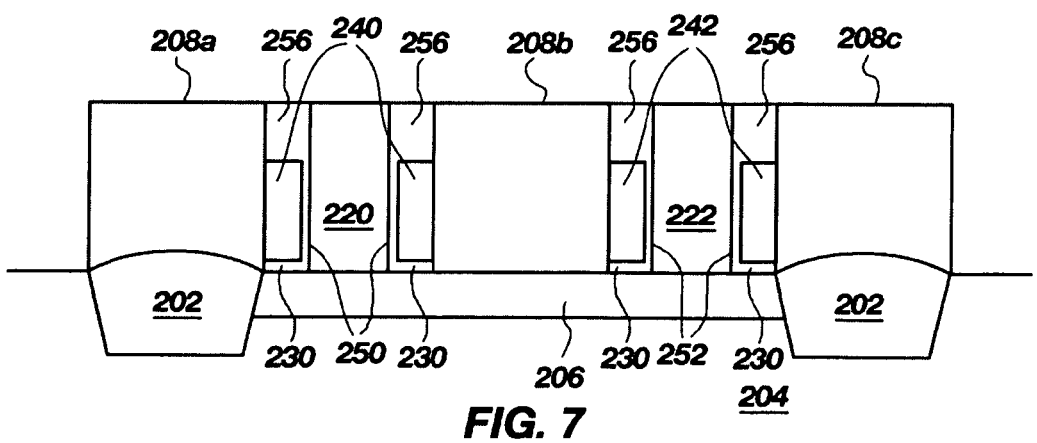
FIG. 7 is a simplified cross-sectional view of the substrate of FIG. 6 at a later point in processing, in accordance with an embodiment of the present invention.

FIG. 7 is a simplified cross-sectional view of the structure shown in FIG. 6 at a later point in processing, in accordance with an embodiment of the present invention. An insulating layer is formed over the structure shown in FIG. 6 and subsequently etched back to form a relatively planar surface. Although a conventional chemical-mechanical polishing process can be used for the etch back step, it will be appreciated that other suitable etch back processes may be used as well. The etch back process results in the formation of insulating spacers 256 to isolate the gates 240, 242 of the vertical transistors 250, 252. The insulating layer, and consequently, the insulating spacers 256, can be formed from a silicon oxide material, or other material, that is selective to a silicon nitride etch process.

Figure 8:
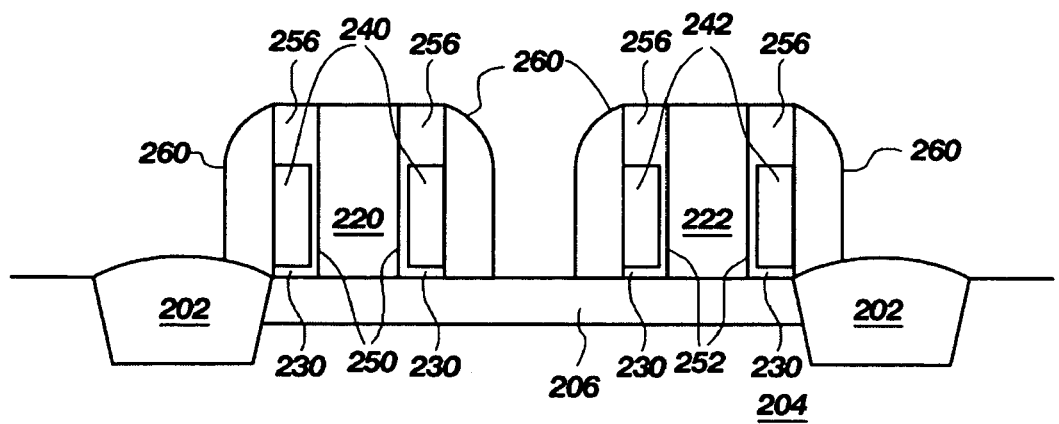
FIG. 8 is a simplified cross-sectional view of the substrate of FIG. 7 at a later point in processing, in accordance with an embodiment of the present invention.

FIG. 8 is a simplified cross-sectional view of the structure shown in FIG. 7 at a later point in processing, in accordance with an embodiment of the present invention. An etch process is used to remove the silicon nitride sacrificial structures 208a–c to leave the epitaxial posts 220, 222, the vertical transistors 250, 252, and the insulating spacers 256. An insulating material is then deposited over the remaining structure and anisotropically etched back to form sidewalls 260 that isolate the gates 240, 242 of the vertical transistors 250, 252, respectively. As shown in FIG. 2B, a dielectric interlayer 264 is subsequently deposited over the existing structure and etched back to form a planar surface on which digit lines and storage capacitors can be formed. Still with reference to FIG. 2B, a via 270 is formed through the dielectric interlayer 264 to expose a portion the active area 206. A conductive material 272 is subsequently deposited over the structure and in the via 270 to electrically contact the active area 206. The conductive material 272 is masked and etched to form a digit line contact.

Figure 9:
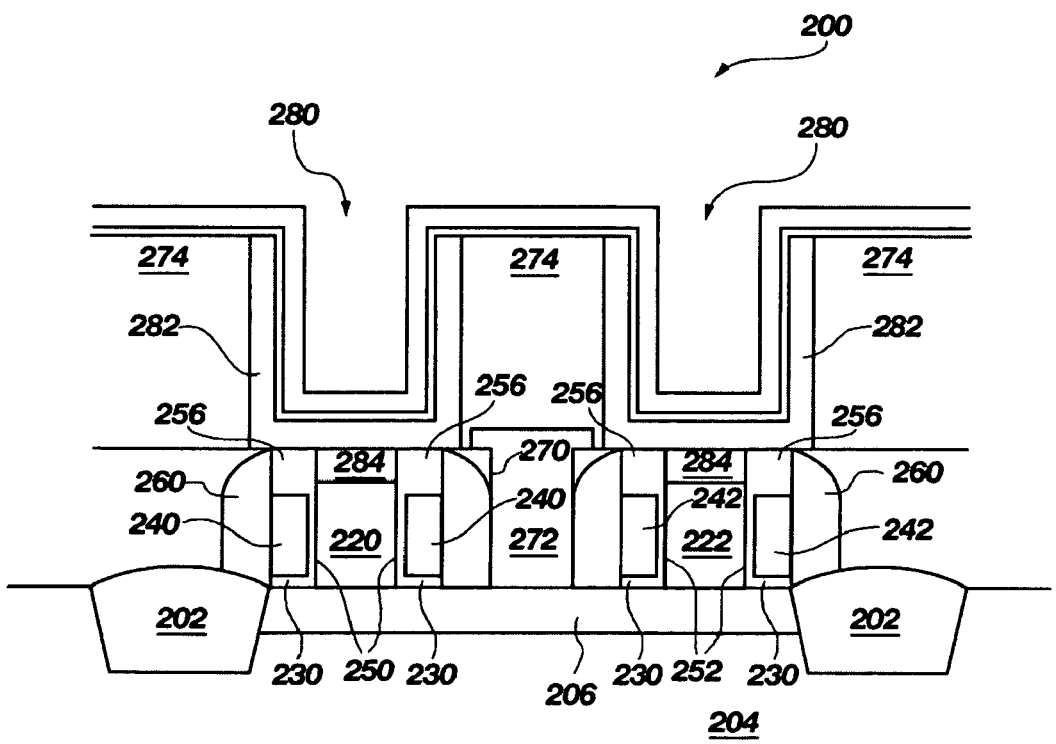
FIG. 9 is a simplified cross-sectional view of the structure of FIG. 2B at a later point in processing, in accordance with an embodiment of the present invention.

FIG. 9 is a simplified cross-sectional view of the structure shown in FIG. 2B at a later point in processing, in accordance with an embodiment of the present invention. A second dielectric interlayer 274 is deposited over the structure and, using conventional methods, container shaped memory cell capacitors 280 are formed in the second dielectric interlayer 274 and have a first capacitor plate 282 electrically coupled to a respective epitaxial post 220, 222. The first capacitor plate 282 can be formed from a highly doped polysilicon material; however, it will be appreciated that other suitable materials may be used as well. Following the formation of the first capacitor plates 282 of the memory cell capacitors 280, dopants from the highly doped polysilicon layer are diffused into the respective epitaxial post 220, 222 by heating the substrate 204. As a result, lightly doped conductive regions 284 are created in the epitaxial posts 220, 222 in a region adjacent the insulating spacers 256. The lightly doped conductive regions 284 provide a conductive path between a memory cell capacitor 280 and the respective gate 240, 242 of the vertical transistors 250, 252. Thus, when a vertical transistor is activated, the memory cell capacitor 280 can be electrically coupled to the active area 206.

Although embodiments of the present invention have been described as including container shaped memory cell capacitors 280, it will be appreciated that alternative capacitor structures may also be used as well without departing from the scope of the present invention. For example, conventional stacked capacitor structures electrically coupled to the epitaxial posts 220, 222 may be used in an alternative embodiment of the present invention. Alternatively, capacitors having a first capacitor plate with multiple polysilicon layers, that is, a "finned" capacitor, may also be used. Moreover, other modifications may be made to the memory cell capacitors 280 as well and still remain within the scope of the present invention. An example of such a modification includes forming memory cell capacitors 280 having a rough surface such as a hemispherical silicon grain (HSG) layer (not shown). Consequently, the present invention is not limited to the specific embodiments described herein.

Figure 10:
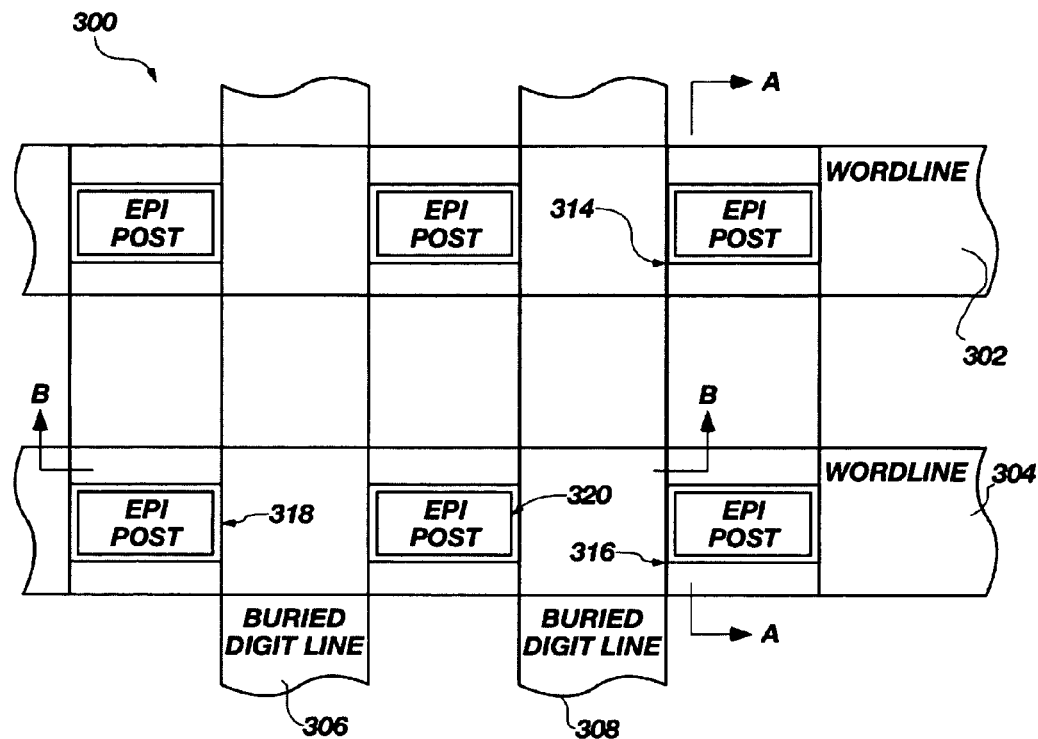
FIG. 10 is simplified top plan view of memory cells, in accordance with an embodiment of the present invention.

FIG. 10 is a top plan view of an array of memory cells 300, according to an embodiment of the present invention. As shown in FIG. 10, capacitors have not been illustrated in order to avoid unnecessarily obscuring the other features of the array of memory cells 300. In the present illustration, the respective array of memory cells 300 is illustrated as including word lines 302, 304 for selecting a specific row of memory cells. The corresponding word lines are electrically coupled to the respective gate areas of the corresponding pass or access gate of the vertical memory cell, in accordance with the fabrication of the vertical memory cells described herein. Furthermore, the array of memory cells 300, illustrated with respect to the embodiment of FIG. 10, further includes buried digit lines 306, 308 implemented generally orthogonal to word lines 302, 304. Formation of the buried digit lines 306, 308 is well known in the art and can be formed using conventional processing methods.

Figure 11:
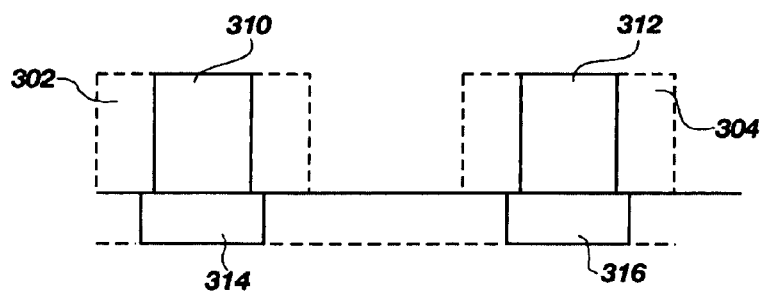
FIG. 11 is a simplified cross-sectional view of a memory cell, in accordance with the embodiment of FIG. 10.

FIG. 11 is a simplified cross-sectional view of an array of memory cells 300 (FIG. 10) along A—A illustrating only a subset of the corresponding layers previously discussed with reference to the fabrication of a vertical transistor. For clarity, cross-sectional view A—A illustrates the vertical transistor having depletion regions 310, 312 about a pair of epitaxial posts (FIG. 10). Transistor depletion regions are respectively surrounded by the corresponding word lines 302, 304 illustrated as extending in a Z-direction with respect to the illustration of FIG. 11. FIG. 11 further illustrates respective first portions of active areas 314, 316 located below the corresponding transistor depletion regions 310, 312. Active areas 314, 316 provide a contact point for coupling to a digit line for coupling the charge stored within the corresponding capacitors.

Figure 12:
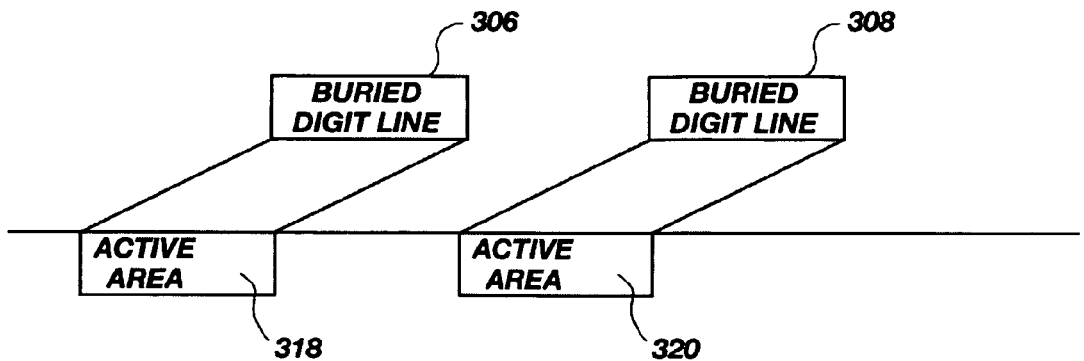
FIG. 12 is another simplified cross-sectional view of a memory cell, in accordance with the embodiment of FIG. 10.

FIG. 12 is a cross-sectional view of the array of memory cells 300 (FIG. 10) along B—B of FIG. 10. FIG. 12 illustrates the coupling of buried digit lines 306, 308 with second portions of active areas 318, 320. As illustrated, buried digit lines 306, 308 couple with active areas 318, 320 using a sloped interconnection.

Figure 13:
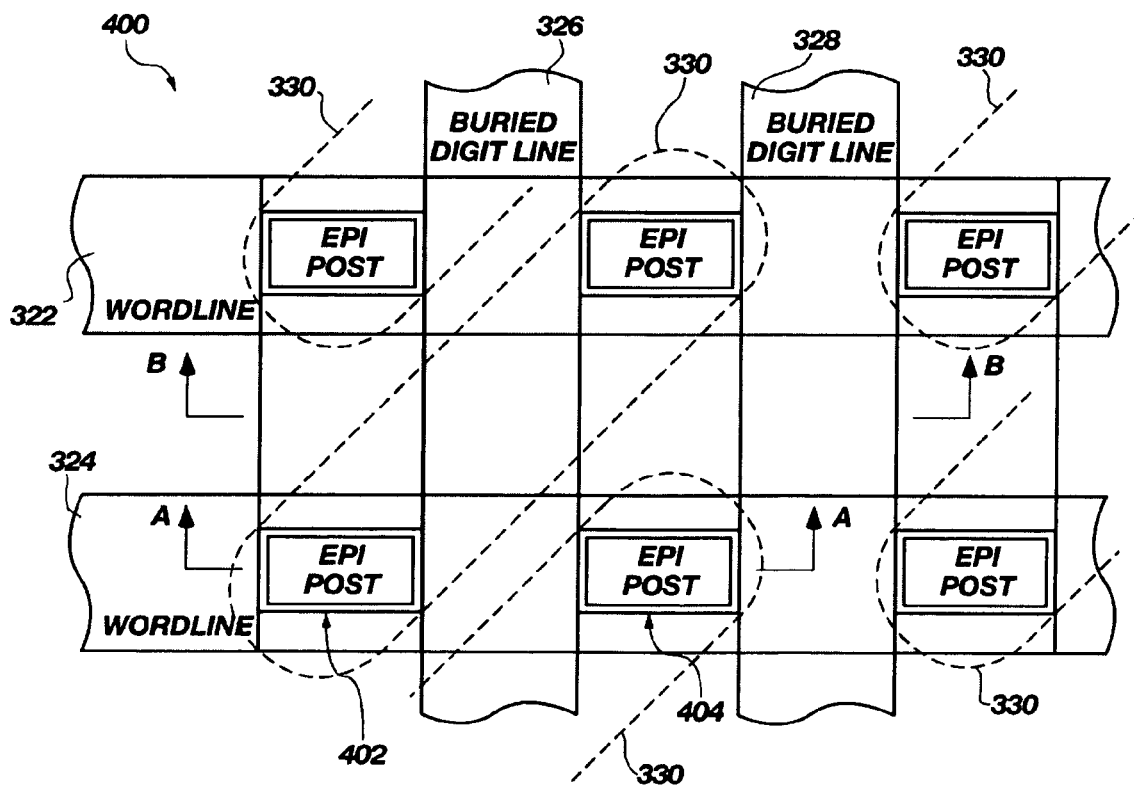
FIG. 13 is simplified top plan view of memory cells, in accordance with an embodiment of the present invention.

FIG. 13 is a top plan view of an array of memory cells 400 according to an embodiment of the present invention. As shown in FIG. 13, capacitors have not been illustrated in order to avoid unnecessarily obscuring the other structures of the array of memory cells 400. Array of memory cells 400 includes one or more epitaxial posts which are used for forming an access or vertical transistor. The transistors, when activated, form transistor depletion regions 402, 404. The array of memory cells 400 is formed within discrete active areas 330 which are arranged in a diagonal configuration with respect to word lines 322, 324 and buried digit lines 326, 328.

Figure 14:
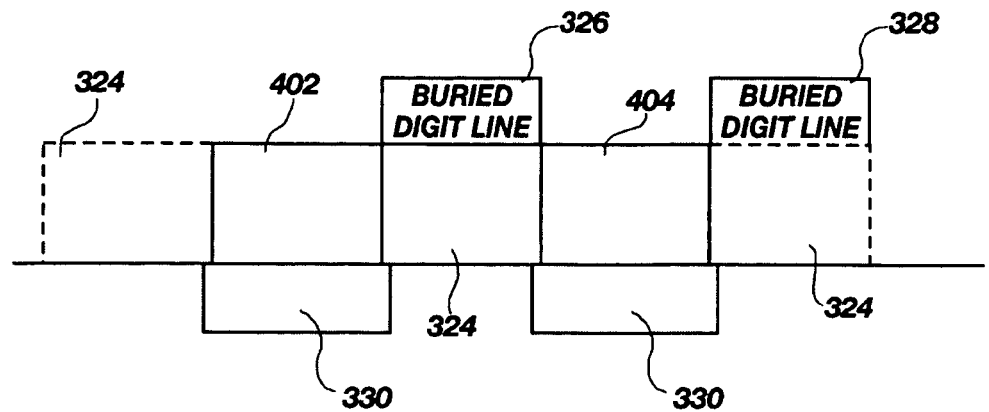
FIG. 14 is a simplified cross-sectional view of a memory cell, in accordance with the embodiment of FIG. 13.

FIG. 14 is a simplified cross-sectional view of a memory cell of the array of memory cells 400 (FIG. 13) along A—A of FIG. 13. As illustrated, word line 324 extends in a horizontal direction, as illustrated, causing the vertical transistors to form transistor depletion regions 402, 404 over first portion of active areas 330.

Figure 15:
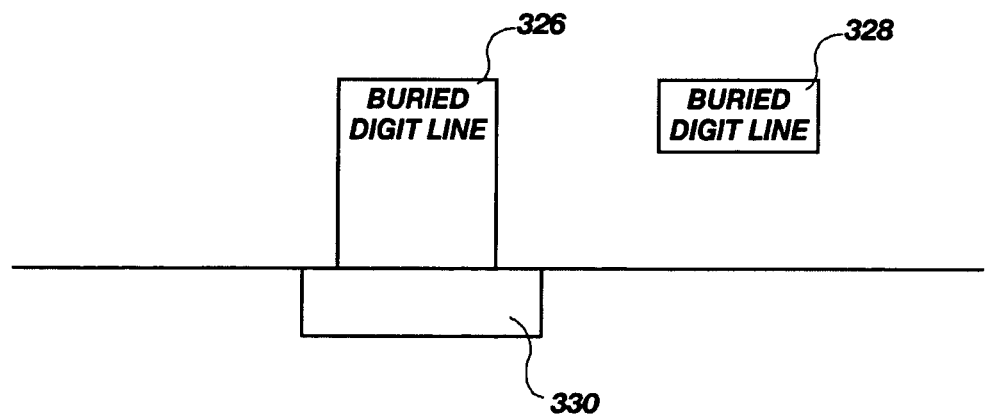
FIG. 15 is another simplified cross-sectional view of a memory cell, in accordance with the embodiment of FIG. 13.

In order to complete the operation of the memory cell by providing an electrical path for the flow of charge from the capacitor to a buried digit line 326 when a transistor depletion region 402 is formed through the activation of word line 324, buried digit line 326 must be electrically coupled at a second portion of the discrete active area 330. FIG. 15 is a simplified cross-sectional view of a memory cell along B—B of FIG. 13. Due to the diagonally formed discrete active area 330, buried digit line 326 may vertically couple with the second portion of the discrete active area 330 using a vertical contact which is in contrast to the sloped buried digit line contact of FIG. 12. Those of ordinary skill in the art appreciate that the formation of a vertical contact is easier to print and form than a sloped contact, an example of which is illustrated with reference to FIG. 12. One example of the formation of discrete active areas includes the formation of discrete active areas utilizing a shallow trench isolation (STI) technique, the specifics of which are known and appreciated by those of ordinary skill in the art.

Figure 16:
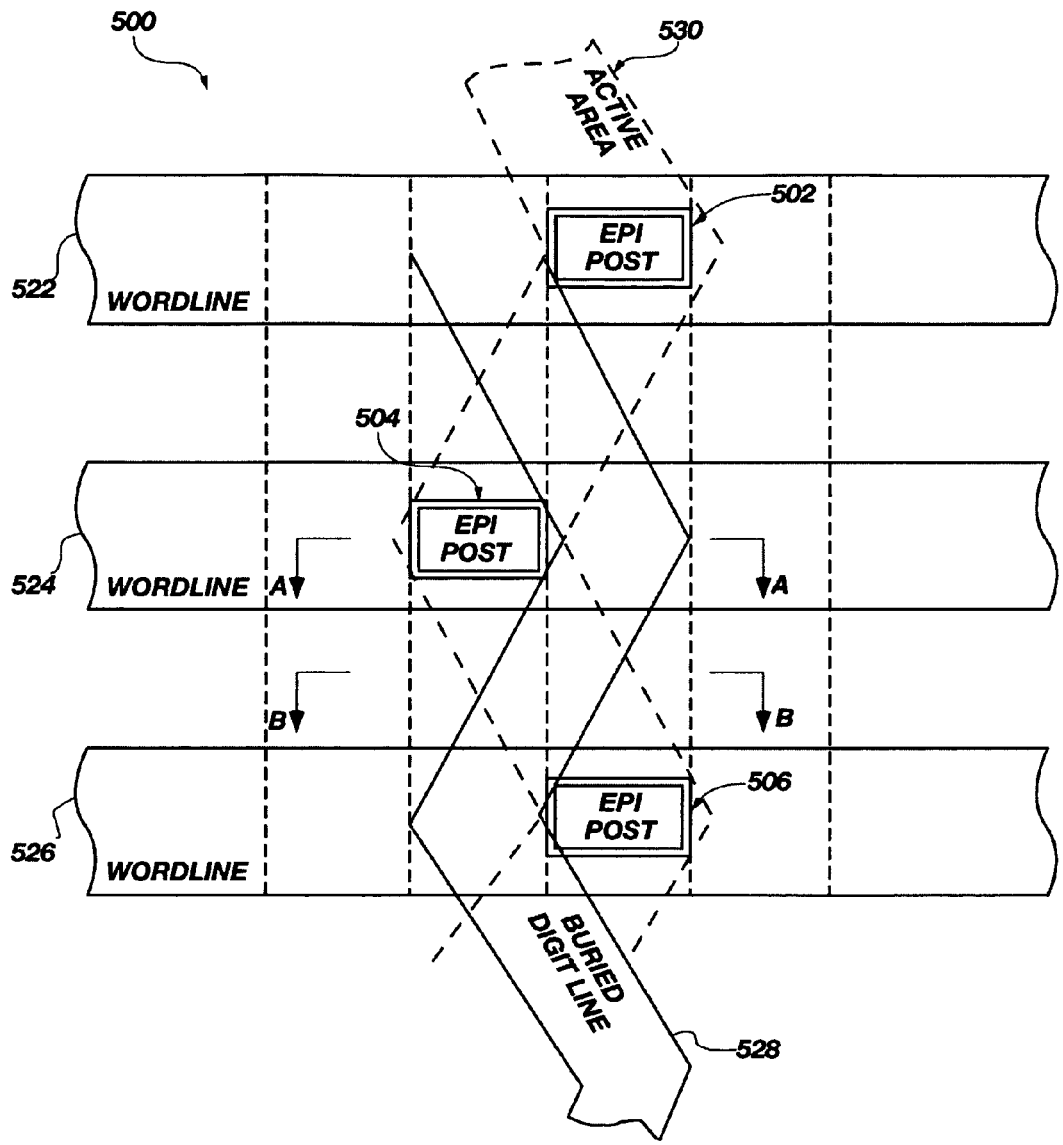
FIG. 16 is simplified top plan view of memory cells, in accordance with an embodiment of the present invention.

FIG. 16 is a top plan view of an array of memory cells 500, according to an embodiment of the present invention. As shown in FIG. 16, capacitors have not been illustrated in order to avoid unnecessarily obscuring the other structures of the array of memory cells 500. Array of memory cells 500 includes one or more epitaxial posts which are used for forming an access or vertical transistor. The transistors, when activated, form transistor depletion regions 502–506. The array of memory cells 500 is formed within a continuous active area 530 which is arranged in a generally serpentine configuration with respect to word lines 522–526.

A buried digit line 528 is also configured in a serpentine arrangement with both buried digit line 528 and active area 530 having topologically overlapping regions. Furthermore, buried digit line 528 and active area 530 are configured in a generally orthogonal relationship with word lines 522–526. In the present embodiment, buried digit line 528 and active area 530 topologically overlap, as illustrated in a cross-sectional arrangement as shown at B—B, by a width approximately greater than the individual width of one or more of the buried digit line 528 and active area 530.

Figure 17:
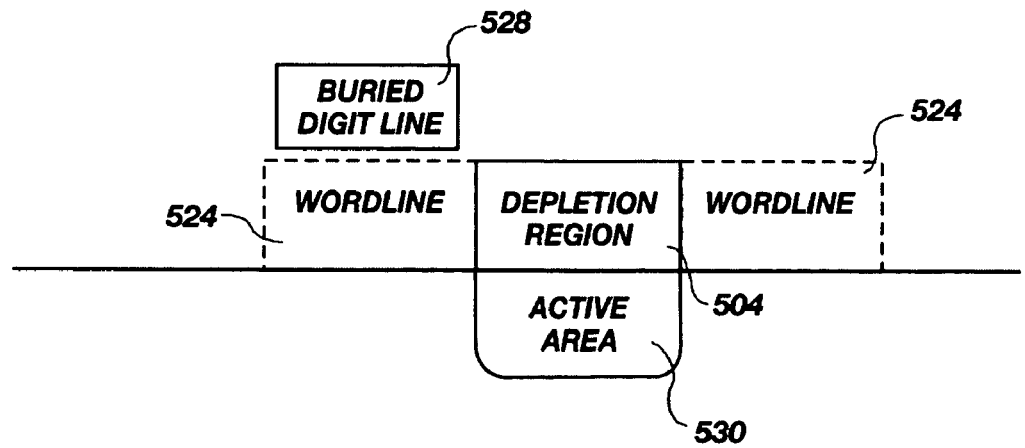
FIG. 17 is a simplified cross-sectional view of a memory cell, in accordance with the embodiment of FIG. 16.

FIG. 17 is a simplified cross-sectional view of a memory cell of the array of memory cells 500 (FIG. 16) along A—A of FIG. 16. As illustrated, word line 524 extends in a horizontal direction, as illustrated, causing the vertical transistors to form transistor depletion region 504 over a first portion of active area 530. As illustrated, buried digit line 528 and a first portion of active area 530 along A—A of FIG. 16 do not overlap and therefore does not accommodate the formation of a vertical contact between buried digit line 528 and active area 530.

Figure 18:
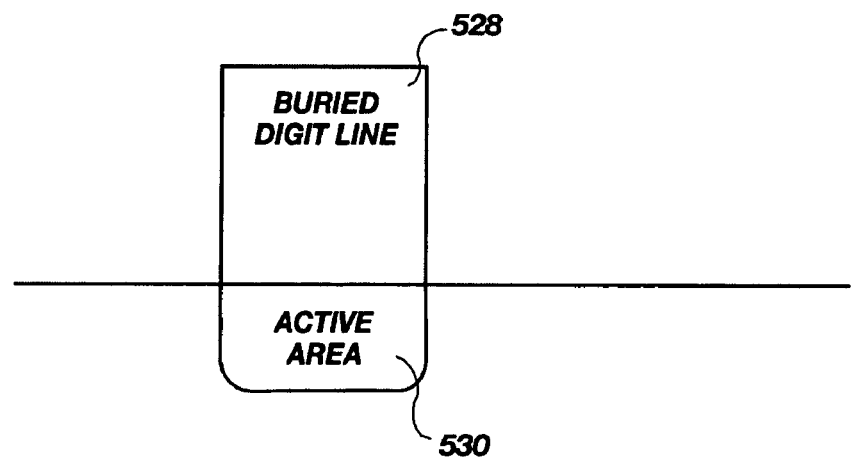
FIG. 18 is another simplified cross-sectional view of a memory cell, in accordance with the embodiment of FIG. 16.

In order to complete the operation of the memory cell by providing an electrical path for the flow of charge from the capacitor to buried digit line 528 when a transistor depletion region 504 is formed through the activation of word line 524, buried digit line 528 must be electrically coupled at a second portion of the discrete active area 530. FIG. 18 is a simplified cross-sectional view of a memory cell from the array of memory cells along B—B of FIG. 16. Due to the overlapping serpentine configuration of buried digit line 528 with respect to active area 530, buried digit line 528 may vertically couple with the second portion of the discrete active area 530 using a vertical contact which, as appreciated by those of ordinary skill in the art, is more accurately fabricated by existing manufacturing processes. Furthermore, as illustrated with respect to the embodiment of FIG. 16, the width of the contact formed between buried digit line 528 and active area 530 is approximately greater than the entire width of one or more of the buried digit line 528 and active area 530. Such an overlap may be commonly referred to as a "half-weave" signifying the overlapping nature of the serpentine arrangements of buried digit line 528 and active area 530.

Figure 19:
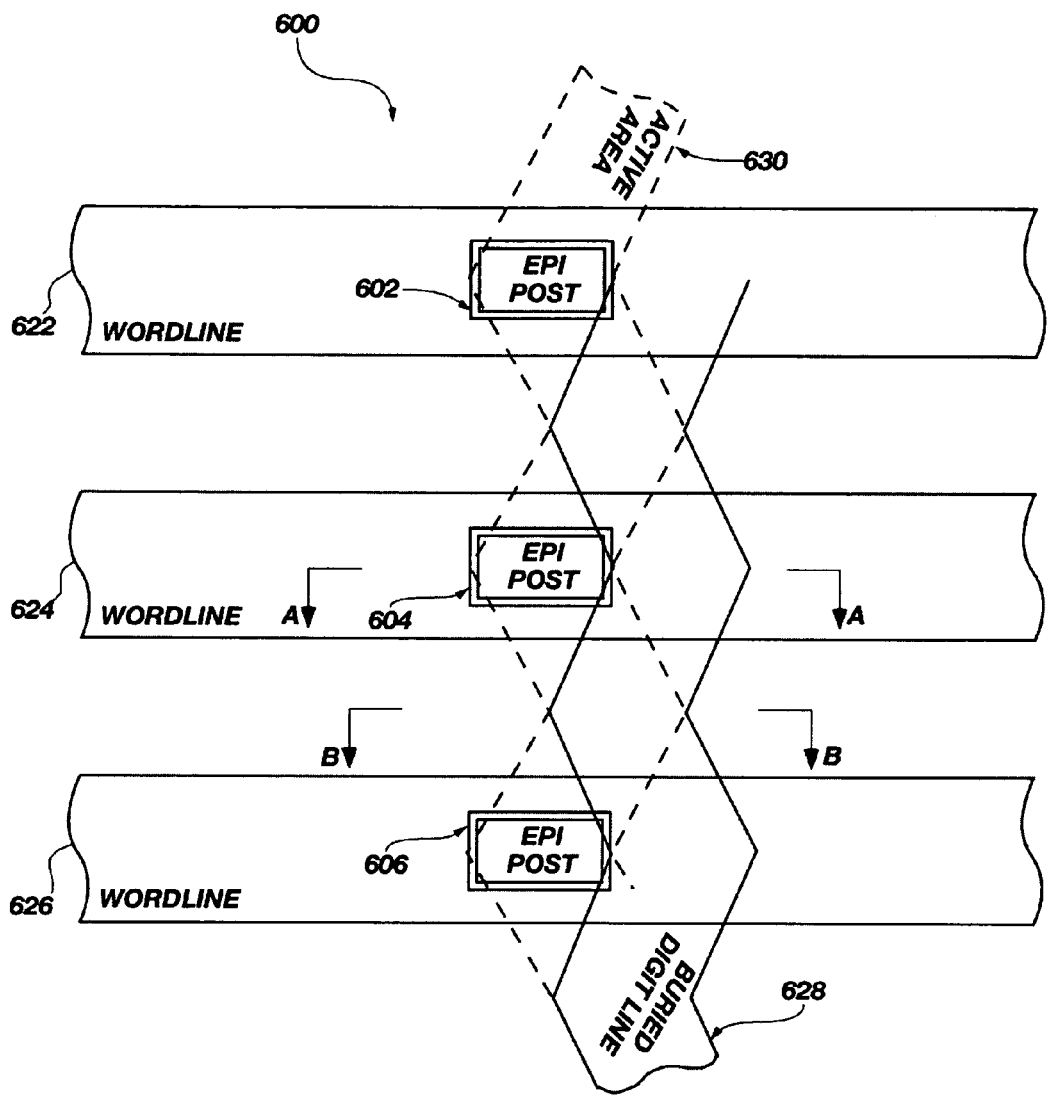
FIG. 19 is simplified top plan view of memory cells, in accordance with an embodiment of the present invention.

FIG. 19 is a top plan view of an array of memory cells 600, according to an embodiment of the present invention. As shown in FIG. 19, capacitors have not been illustrated in order to avoid unnecessarily obscuring the other structures of the array of memory cells 600. Array of memory cells 600 includes one or more epitaxial posts which are used for forming an access or vertical transistor. The transistors, when activated, form transistor depletion regions 602–606. The array of memory cells 600 is formed within a discrete continuous active area 630 which is arranged in a generally serpentine configuration with respect to word lines 622–626.

A buried digit line 628 is also configured in a serpentine arrangement with both buried digit line 628 and active area 630 having topologically overlapping regions. Furthermore, buried digit line 628 and active area 630 are configured in a generally orthogonal relationship with word lines 622–626. In the present embodiment, buried digit line 628 and active area 630 topologically overlap, as illustrated for approximately the entire width of one or more of the buried digit line 628 and active area 630 dimensions.

Figure 20:
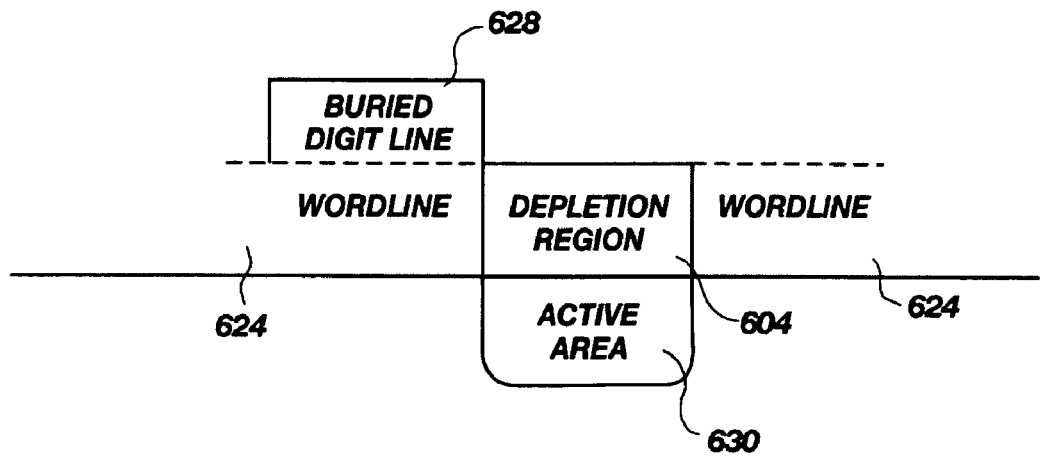
FIG. 20 is a simplified cross-sectional view of a memory cell, in accordance with the embodiment of FIG. 19.

FIG. 20 is a simplified cross-sectional view of a memory cell of the array of memory cells 600 (FIG. 19) along A—A of FIG. 19. As illustrated, word line 624 extends in a horizontal direction, as illustrated, causing the vertical transistor to form transistor depletion region 604 over a first portion of active area 630. As illustrated, buried digit line 628 and a first portion of active area 630 along A—A of FIG. 19 do not overlap and therefore do not accommodate the formation of a vertical contact between buried digit line 628 and active area 630.

Figure 21:
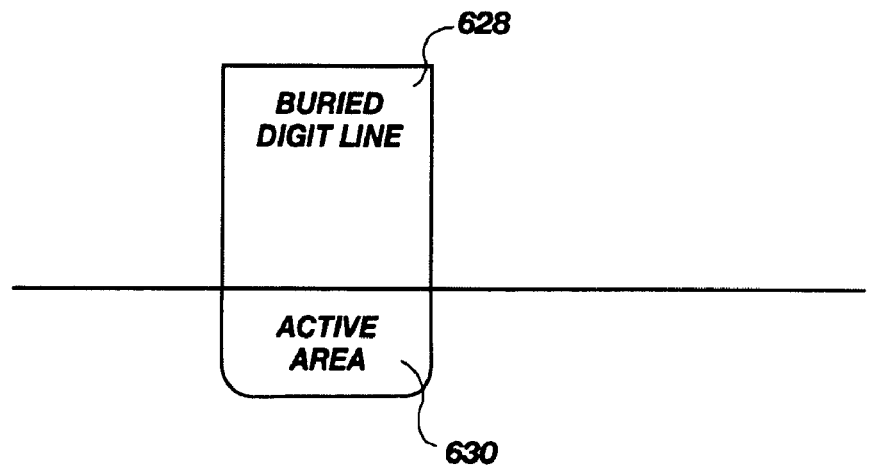
FIG. 21 is another simplified cross-sectional view of a memory cell, in accordance with the embodiment of FIG. 19.

In order to complete the operation of the memory cell by providing an electrical path for the flow of charge from the capacitor to buried digit line 628 when a transistor depletion region 604 is formed through the activation of word line 624, buried digit line 628 must be electrically coupled at a second portion of the continuous active area 630. FIG. 21 is a simplified cross-sectional view of a memory cell from the array of memory cells along B—B of FIG. 19. Due to the overlapping serpentine configuration of buried digit line 628 with respect to active area 630, buried digit line 628 may vertically couple with the second portion of the continuous active area 630 using a vertical contact which, as appreciated by those of ordinary skill in the art, is more accurately fabricated by existing manufacturing processes. Furthermore, as illustrated with respect to the embodiment of FIG. 19, the width of the contact formed between buried digit line 628 and active area 630 is approximately equal to the entire width of one or more of the buried digit line 628 and active area 630. Such an overlap may be commonly referred to as a "quarter-weave" signifying the overlapping nature of the serpentine arrangements of buried digit line 628 and active area 630.

Figure 22:
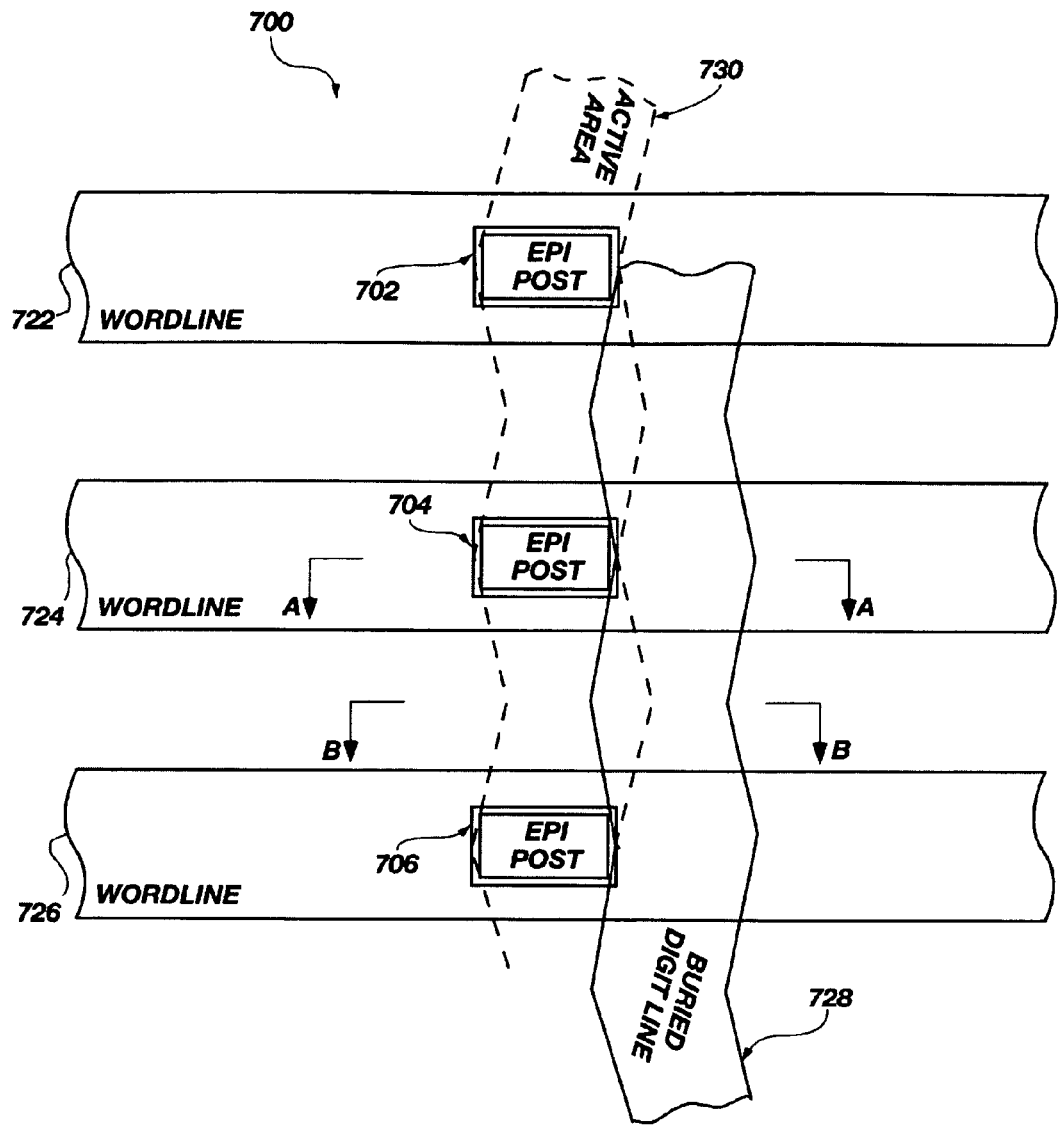
FIG. 22 is simplified top plan view of memory cells, in accordance with an embodiment of the present invention.

FIG. 22 is a top plan view of an array of memory cells 700, according to an embodiment of the present invention. As shown in FIG. 22, capacitors have not been illustrated in order to avoid unnecessarily obscuring the other structures of the array of memory cells 700. Array of memory cells 700 includes one or more epitaxial posts which are used for forming an access or vertical transistor. The transistors, when activated, form transistor depletion regions 702–706. The array of memory cells 700 is formed within a continuous active area 730 which is arranged in a generally serpentine configuration with respect to word lines 722–726.

A buried digit line 728 is also configured in a serpentine arrangement with both buried digit line 728 and active area 730 having topologically overlapping regions. Furthermore, buried digit line 728 and active area 730 are configured in a generally orthogonal relationship with word lines 722–726. In the present embodiment, buried digit line 728 and active area 730 topologically overlap as illustrated for less than the entire approximate width of one or more of the buried digit line 728 and active area 730 dimensions.

Figure 23:
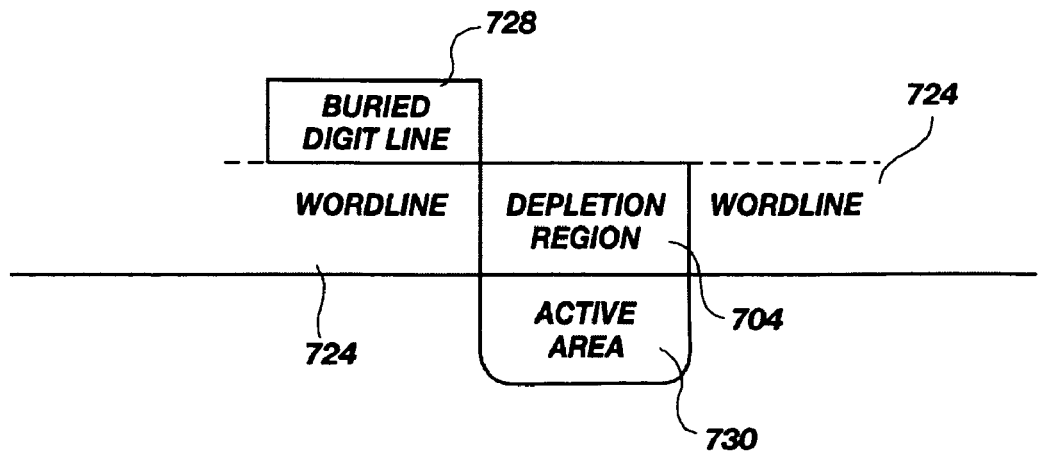
FIG. 23 is a simplified cross-sectional view of a memory cell, in accordance with the embodiment of FIG. 22.

FIG. 23 is a simplified cross-sectional view of a memory cell of the array of memory cells 700 (FIG. 22) along A—A of FIG. 22. As illustrated, word line 724 extends in a horizontal direction, as illustrated, causing the vertical transistor to form a transistor depletion region 704 over a first portion of active area 730. As illustrated, buried digit line 728 and a first portion of active area 730 along A—A of FIG. 22 do not overlap and therefore does not accommodate the formation of a vertical contact between the buried digit line 728 and active area 730.

Figure 24:
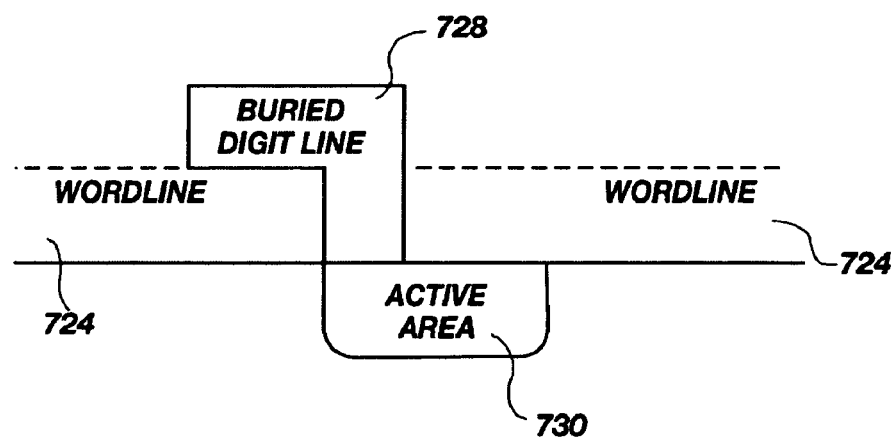
FIG. 24 is another simplified cross-sectional view of a memory cell, in accordance with the embodiment of FIG. 22.

In order to complete the operation of the memory cell by providing an electrical path for flow of a charge from the capacitor to buried digit line 728 when a transistor depletion region 704 is formed through the activation of word line 724, buried digit line 728 must be electrically coupled at a second portion of the discrete active area 730. FIG. 24 is a simplified cross-sectional view of a memory cell from the array of memory cells along B—B of FIG. 22. Due to the overlapping serpentine configuration of buried digit line 728 with respect to active area 730, buried digit line 728 may vertically couple with the second portion of the discrete active area 730 using a vertical contact which, as appreciated by those of ordinary skill in the art, is more accurately fabricated by existing manufacturing processes. Furthermore, as illustrated with respect to the embodiment of FIG. 22, the width of the contact formed between buried digit line 728 and active area 730 is approximately less than the entire width of one or more of the buried digit line 728 and active area 730. Such an overlap may be commonly referred to as a "sub-quarter weave" signifying the overlapping nature of the serpentine arrangements of buried digit line 728 and active area 730.

Figure 25:
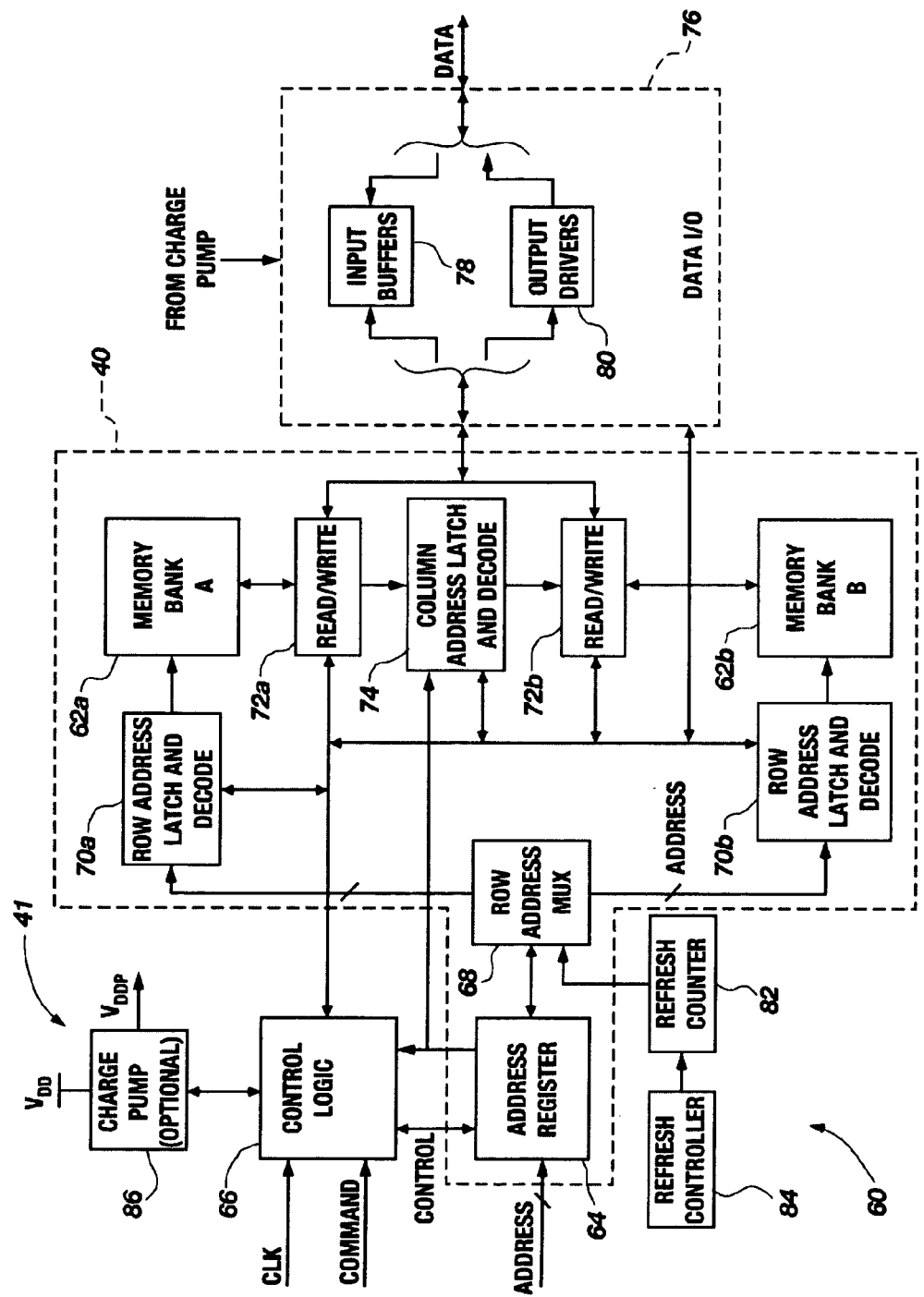
FIG. 25 is a functional block diagram of a memory circuit that includes memory cells according to an embodiment of the present invention.

FIG. 25 is a functional block diagram of one embodiment of a memory device 60, which includes memory banks 62a and 62b. These memory banks each incorporate a memory array including memory cells according to an embodiment of the present invention. In one embodiment, the memory device 60 is a synchronous DRAM (SDRAM), although it may be another type of memory in other embodiments.

The memory device 60 includes an address register 64, which receives an address from an ADDRESS bus. A control logic circuit 66 (i) receives a clock (CLK) signal; (ii) receives clock enable (CKIE), chip select (CS), row address strobe (RAS), column address strobe (CAS), and write enable (WE) signals from the COMMAND bus, and (iii) communicates with the other circuits of the memory device 60. A row-address multiplexer 68 receives the address signal from the address register 64 and provides the row address to the row-address latch-and-decode circuits 70a and 70b for the memory bank 62a or the memory bank 62b, respectively. During read and write cycles, the row-address latch-and-decode circuits 70a and 70b activate the word lines of the addressed rows of memory cells in the memory banks 62a and 62b, respectively. Read/write circuits 72a and 72b read data from the addressed memory cells in the memory banks 62a and 62b, respectively, during a read cycle, and write data to the addressed memory cells during a write cycle. A column-address latch-and-decode circuit 74 receives the address from the address register 64 and provides the column address of the selected memory cells to the read/write circuits 72a and 72b. For clarity, the address register 64, the row-address multiplexer 68, the row-address latch-and-decode circuits 70a and 70b, and the column-address latch-and-decode circuit 74 can be collectively referred to as an address decoder.

A data input/output (I/O) circuit 76 includes a plurality of input buffers 78. During a write cycle, the buffers 78 receive and store data from the DATA bus, and the read/write circuits 72a and 72b provide the stored data to the memory banks 62a and 62b, respectively. The data I/O circuit 76 also includes a plurality of output drivers 80. During a read cycle, the read/write circuits 72a and 72b provide data from the memory banks 62a and 62b, respectively, to the drivers 80, which in turn provide this data to the DATA bus.

A refresh counter 82 stores the address of the row of memory cells to be refreshed either during a conventional auto-refresh mode or self-refresh mode. After the row is refreshed, a refresh controller 84 updates the address in the refresh counter 82, typically by incrementing or decrementing, the contents of the refresh counter 82 by one. Although shown separately, the refresh controller 84 may be part of the control logic circuit 66 in other embodiments of the memory device 60. The memory device 60 may also include an optional charge pump 86, which steps up the power-supply voltage $V_{DD}$ to a voltage $V_{DDP}$. In one embodiment, the charge pump 86 generates $V_{DDP}$ approximately 1–1.5 V higher than $V_{DD}$. The memory device 60 may also use VDDP to conventionally overdrive selected internal transistors.

Figure 26:
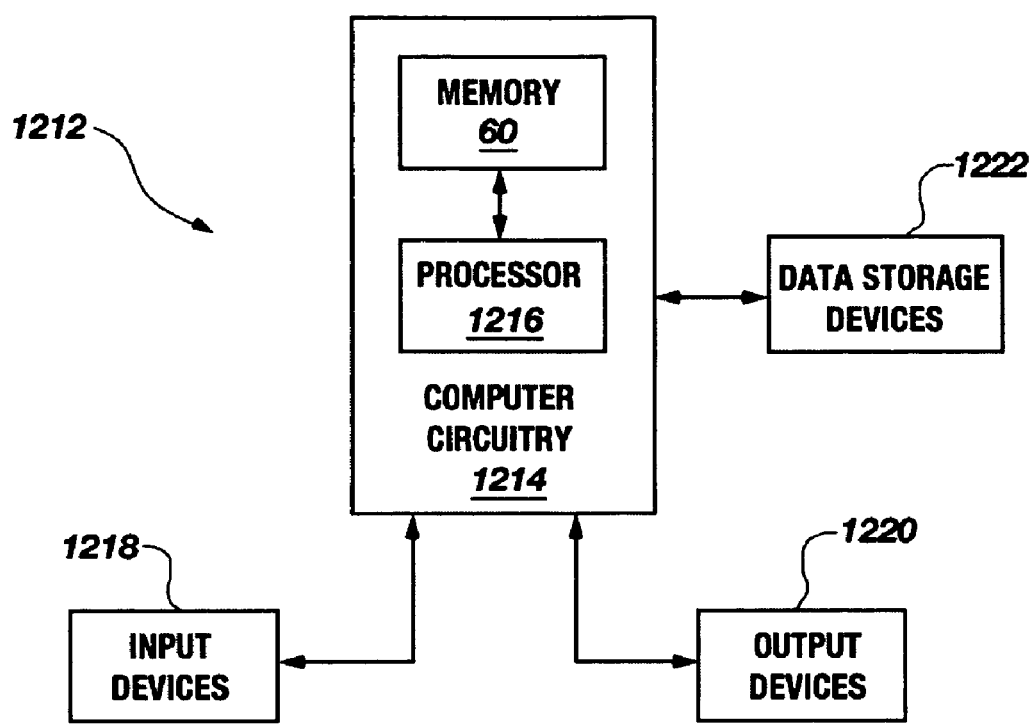
FIG. 26 is a functional block diagram of a computer system including a memory device, according to one or more embodiments of the present invention.

FIG. 26 is a block diagram of an electronic system 1212, such as a computer system, that incorporates the memory device 60 of FIG. 25. The system 1212 also includes computer circuitry 1214 for performing computer functions, such as executing software to perform desired calculations and tasks. The circuitry 1214 typically includes a processor 1216 and the memory device 60, which is coupled to the processor 1216. One or more input devices 1218, such as a keyboard or a mouse, are coupled to the computer circuitry 1214 and allow an operator (not shown) to manually input data thereto. One or more output devices 1220 are coupled to the computer circuitry 1214 to provide to the operator data generated by the computer circuitry 1214. Examples of such output devices 1220 include a printer and a video display unit. One or more data storage devices 1222 are coupled to the computer circuitry 1214 to store data on or retrieve data from external storage media (not shown). Examples of the storage devices 1222 and the corresponding storage media include drives that accept hard and floppy disks, tape cassettes, and compact disk read-only memories (CD-ROMs). Typically, the computer circuitry 1214 includes address data and command buses and a clock line that is respectively coupled to the ADDRESS, DATA, and COMMAND buses, and the CLK line of the memory device 60.

From the foregoing it will be appreciated that, although specific embodiments of the invention have been described herein for purposes of illustration, various modifications may be made without deviating from the spirit and scope of the invention. For example, the memory cell has been illustrated as having epitaxial posts with a rectangular or quadrilateral cross-sectional area. However, the epitaxial posts can be formed having a generally circular cross-sectional area or a generally polygonal cross-sectional area as well. Accordingly, the invention is not limited except as by the appended claims.

What is claimed is:

1. A DRAM cell formed on a surface of a semiconductor substrate, comprising:
   an active area formed in the substrate;
   a vertically oriented access transistor including a first end disposed over a first portion of the active area;
   a capacitor formed on and electrically coupled to a second end of the vertically oriented access transistor; and
   a buried digit line electrically coupled in a vertically oriented contact to a second portion of the active area.

2. The DRAM cell of claim 1, wherein the active area is a discrete active area isolated from other discrete active areas.

3. The DRAM cell of claim 2, wherein the discrete active area is oriented in a nonorthogonal orientation with the buried digit line.

4. The DRAM cell of claim 3, wherein the second portion of the active area corresponds to an intersection of the buried digit line and the discrete active area.

5. The DRAM cell of claim 1, wherein:
   the active area is configured in a continuous serpentine arrangement around the DRAM cell; and
   the buried digit line is configured in a continuous serpentine arrangement at least partially overlapping the active area.

6. The DRAM cell of claim 5, wherein the buried digit line is configured in a serpentine arrangement mirroring the serpentine arrangement of the active area.

7. The DRAM cell of claim 6, wherein the serpentine arrangement of the buried digit line and the serpentine arrangement of the active area form a half-weave overlapping arrangement.

8. The DRAM cell of claim 6, wherein the serpentine arrangement of the buried digit line and the serpentine arrangement of the active area form a quarter-weave overlapping arrangement.

9. The DRAM cell of claim 6, wherein the serpentine arrangement of the buried digit line and the serpentine arrangement of the active area form a subquarter-weave overlapping arrangement.

10. A memory cell formed on a substrate, comprising:
    an active area formed in the substrate;
    a vertical transistor including a first end disposed over a first portion of the active area, the vertical transistor formed in an epitaxial post formed on a surface of the substrate and extending from the surface of the substrate, the vertical transistor further having a gate formed around a perimeter of the epitaxial post;
    a capacitor formed on the vertical transistor; and
    a buried digit line vertically electrically coupled to a second portion of the active area.

11. The memory cell of claim 10, wherein the buried digit line and the second portion of the active area topologically overlap at an intersection adjacent to the vertical transistor.

12. The memory cell of claim 10, wherein the active area is a discrete active area isolated from other discrete active areas.

13. The memory cell of claim 12, wherein the discrete active area and the buried digit line are configured in respective continuous serpentine arrangements at least partially topologically overlapping to define the second portion of the active area.

14. The memory cell of claim 13, wherein the second portion of the active area is defined by an approximate entire overlap of the continuous active area and the buried digit line.

15. The memory cell of claim 13, wherein the second portion of the active area is defined by less than an entire overlap of the continuous active area and the buried digit line.

16. A memory array formed on a substrate, comprising:
    at least one active area formed in the substrate; and
    a plurality of memory cells formed in at least one active area, each of the plurality of memory cells including:
       a vertically oriented access transistor including a first end disposed over a first portion of the at least one active area;
       a capacitor formed on and electrically coupled to a second end of the vertically oriented access transistor; and
       a buried digit line electrically coupled in a vertically oriented contact to a second portion of the at least one active area.

17. The memory array of claim 16, wherein the at least one active area is a discrete active area isolated from any other discrete active areas.

18. The memory array of claim 17, wherein the discrete continuous active area is oriented in a nonorthogonal orientation with the buried digit line.

19. The memory array of claim 18, wherein the second portion of the at least one active area corresponds to an intersection of the buried digit line and the discrete continuous active area.

20. The memory array of claim 16, wherein:
    the at least one active area is configured in a serpentine arrangement around the plurality of memory cells; and
    the buried digit line is configured in a serpentine arrangement at least partially overlapping the at least one active area.

21. The memory array of claim 20, wherein the second portion of the at least one active area is defined by an approximate entire overlap of the continuous active area and the buried digit line.

22. The memory array of claim 20, wherein the second portion of the at least one active area is defined by less than an entire overlap of the continuous active area and the buried digit line.

23. A memory device, comprising:
    an array of memory cells formed on a substrate, the memory cells of the array arranged in rows and columns, each of the rows having a word line;

row and column address circuitry coupled to the array of memory cells and responsive to an address bus, the circuitry configured to access specific ones of the array of memory cells; and each of the memory cells of the array including:
an active area formed in the substrate;
a vertically oriented access transistor including a first end disposed over a first portion of the active area;
a capacitor formed on and electrically coupled to a second end of the vertically oriented access transistor; and
a buried digit line electrically coupled in a vertically oriented contact to a second portion of the active area.

24. The memory device of claim 23, wherein active area is a continuous active area isolated from any other continuous active areas.

25. The memory device of claim 24, wherein the discrete active area is oriented in a nonorthogonal orientation with the buried digit line.

26. The memory device of claim 25, wherein the second portion of the active area corresponds to an intersection of the buried digit line and the discrete active area.

27. The memory device of claim 23, wherein:
the active area is configured in a continuous serpentine arrangement around the array of memory cells; and
the buried digit line is configured in a serpentine arrangement at least partially overlapping the active area.

28. The memory device of claim 27, wherein the second portion of the active area is defined by an approximate entire overlap of the continuous active area and the buried digit line.

29. The memory device of claim 27, wherein the second portion of the active area is defined by less than an entire overlap of the continuous active area and the buried digit line.

30. An electronic system, comprising:
a processor having a processor bus;
an input device coupled to the processor through the processor bus and adapted to allow data to be entered into the electronic system;
an output device coupled to the processor through the processor bus and adapted to allow data to be output from the electronic system; and
a memory device coupled to the processor through the processor bus, the memory device comprising:
a memory array formed on a substrate, comprising:
at least one active area formed in the substrate; and
a plurality of memory cells formed in the at least one active area, each of the plurality of memory cells including:
a vertically oriented access transistor including a first end disposed over a first portion of the at least one active area;
a capacitor formed on and electrically coupled to a second end of the vertically oriented access transistor; and
a buried digit line electrically coupled in a vertically oriented contact to a second portion of the at least one active area.

31. The electronic system of claim 30, wherein the at least one active area is a continuous active area isolated from any other discrete active areas.

32. The electronic system of claim 31, wherein the continuous active area is oriented in a nonorthogonal orientation with the buried digit line.

33. The electronic system of claim 32, wherein the second portion of the at least one active area corresponds to an intersection of the buried digit line and the continuous active area.

34. The electronic system of claim 30, wherein:
the at least one active area is configured in a serpentine arrangement around the plurality of memory cells; and
the buried digit line is configured in a serpentine arrangement at least partially overlapping the at least one active area.

35. The electronic system of claim 34, wherein the second portion of the at least one active area is defined by an approximate entire overlap of the continuous active area and the buried digit line.

36. The electronic system of claim 34, wherein the second portion of the at least one active area is defined by less than an entire overlap of the continuous active area and the buried digit line.

37. A method of forming a memory cell on a surface of a substrate, comprising:
forming at least one active area in the substrate; and
forming a vertically oriented access transistor including a first end disposed over a first portion of the at least one active area;
forming a buried digit line electrically coupled in a vertically oriented contact to a second portion of the at least one active area; and
forming a capacitor electrically coupled to a second end of the vertically oriented access transistor.

38. The method of claim 37, wherein forming the at least one active area in the substrate comprises forming at least one discrete active area isolated from any other discrete active areas.

39. The method of claim 38, wherein forming the at least one discrete active area further comprises forming least one discrete active area oriented in a nonorthogonal orientation with the buried digit line.

40. The method of claim 37, further comprising:
forming the at least one active area in a serpentine arrangement around the memory cell; and
forming the buried digit line in a serpentine arrangement at least partially overlapping the at least one active area.

41. The method of claim 40, further comprising approximately entirely overlapping the at least one active area and the buried digit line at the second portion of the at least one active area.

42. The method of claim 40, further comprising approximately less than entirely overlapping the at least one active area and the buried digit line at the second portion of the at least one active area.

* * * * *

UNITED STATES PATENT AND TRADEMARK OFFICE
CERTIFICATE OF CORRECTION

PATENT NO. : 7,042,047 B2  Page 1 of 1
APPLICATION NO. : 10/933040
DATED : May 9, 2006
INVENTOR(S) : Anton P. Eppich It is certified that error appears in the above-identified patent and that said Letters Patent is hereby corrected as shown below:

In the claims:

| | |
|---|---|
| CLAIM 18, COLUMN 12, LINE 44, | change "continuous active area" to --active area-- |
| CLAIM 19, COLUMN 12, LINES 48-49, | change "discrete continuous active" to --discrete active-- |
| CLAIM 20, COLUMN 12, LINE 51, | change "in a serpentine" to --in a continuous serpentine-- |
| CLAIM 20, COLUMN 12, LINE 53, | change "in a serpentine" to --in a continuous serpentine-- |
| CLAIM 24, COLUMN 13, LINES 16-17, | change both occurrences of "continuous active" to --discrete active-- |
| CLAIM 31, COLUMN 14, LINE 2, | change "continuous active" to --discrete active-- |
| CLAIM 32, COLUMN 14, LINE 5, | change "continuous active" to --discrete active-- |
| CLAIM 33, COLUMN 14, LINE 9, | change "continuous active" to --discrete active-- |

Signed and Sealed this

Twenty-fifth Day of August, 2009

David J. Kappos
*Director of the United States Patent and Trademark Office*